United States Patent [19]

Fushimi

[11] 4,281,414
[45] Jul. 28, 1981

[54] RECEIVING CHANNEL NUMBER INDICATION SYSTEM FOR TELEVISION RECEIVER

[75] Inventor: Kiyoshi Fushimi, Yokohama, Japan

[73] Assignee: Hitachi, Ltd., Tokyo, Japan

[21] Appl. No.: 148,782

[22] Filed: May 12, 1980

[30] Foreign Application Priority Data

May 11, 1979 [JP] Japan .................................. 54-56904

[51] Int. Cl.³ ...................... H04B 1/26; G01R 23/10
[52] U.S. Cl. .................................. 455/158; 358/192.1
[58] Field of Search .............................. 455/157, 158; 358/192.1; 331/64; 324/78 D

[56] References Cited

U.S. PATENT DOCUMENTS 3,509,484  4/1970  Basse et al. .......................... 455/157
3,851,254  11/1974  Merrell et al. ........................ 455/158
3,983,491  9/1976  Yoshisato ............................. 455/158

Primary Examiner—Marc E. Bookbinder
Attorney, Agent, or Firm—Craig and Antonelli

[57] ABSTRACT

An indication system for a television receiver displays a receiving channel number directly from a local oscillation signal of the turner and a signal showing the receiving band associated with the operation of the tuner. An initial value signal is generated from the signal showing the receiving band. The value of the initial value signal is subtracted from the result of counting the local oscillation signal for a predetermined length of time. The resulting difference is divided into six parts, thus producing a pulse signal coincident with the receiving channel number which is to be displayed on an indicator.

3 Claims, 3 Drawing Figures

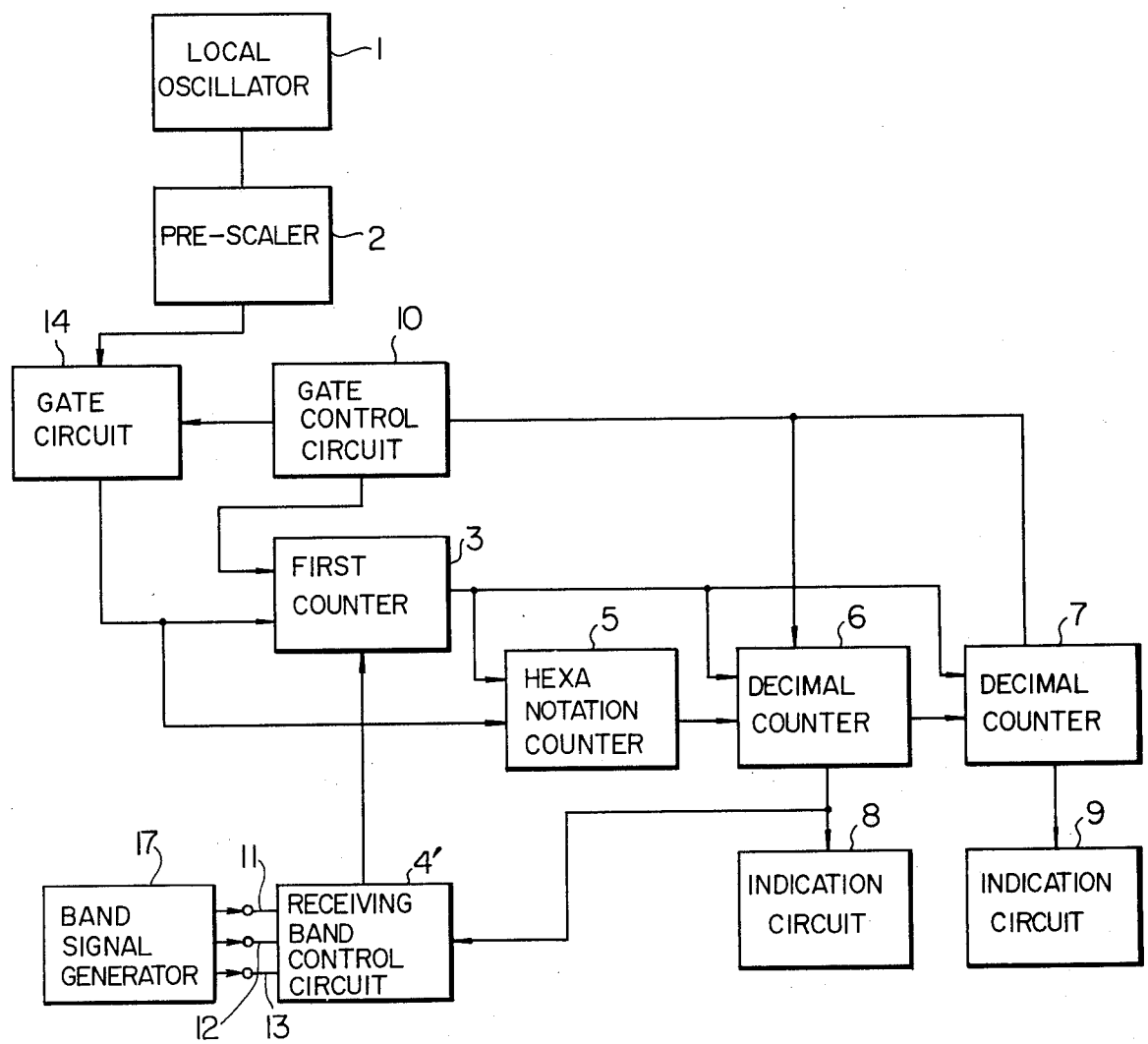
F I G. 3

RECEIVING CHANNEL NUMBER INDICATION SYSTEM FOR TELEVISION RECEIVER

BACKGROUND OF THE INVENTION

1. Field of the Invention

This invention relates to a system for indicating a receiving channel number for a television receiver.

2. Description of the Prior Art

In the prior art receiving channel number indication systems for the television receiver, regardless of whether the means for varying the local oscillation frequency of the tuner includes means for mechanically changing over connection of a coil or a capacitor, or uses a varactor diode, the correspondence between the receiving frequency or the local oscillation frequency and the receiving channel number is attained by the correspondence between a contact or memory means and the receiving channel number.

This is for selecting a receiving channel number not by use of a receiving frequency or a local oscillation frequency but by use of the location of the contact or memory means. First of all, therefore, it is necessary to define or preset the relation between the local oscillation frequency and the receiving channel numbers. If a contact (or memory means) is located at a, for instance, the local oscillation frequency for receiving the channel 2 is preset at the location a. If the local oscillation frequency for receiving the channel 3 is preset at the location a, on the other hand, a different channel is received at the same location. Thus, it is not that the location a has data "2" of the receiving channel number specific to the location a, but the particular location corresponds to the channel number "2" in view of the fact that the location a is defined as the channel number "2." Exactly speaking, in this conventional indication system, it is not a channel number but merely a selected position of the channel selector that is indicated. Thus, this conventional indication system has the disadvantages mentioned below.

(1) Even when the indication system indicates "2" it is not exactly known whether the television receiver really is receiving the second channel. The right indication is obtained only when the local oscillation frequency is preset to receive the channel Nr. 2 at the associated selected position of the channel selector. If the presetting is incorrect, therefore, the indication system erroneously functions.

(2) There is no correlationship between the selected position of the channel selector itself and the receiving frequency, and therefore the presetting is always required to achieve the correlationship.

(3) In the case of auto-presetting wherein the presetting is performed automatically but not manually by receiving a broadcast signal, or in the case of auto-search receiving wherein the tuner automatically searches for a broadcasting station, the relation between the local oscillation frequency and the receiving channel number is not preset in advance and therefore it is not possible to indicate the channel number of the broadcasting station involved.

An example obviating the disadvantages (1) and (2) above is shown by a UHF detent tuner disclosed in U.S. Pat. No. 3,842,683. Since this requires a purely mechanical fine adjustment of tuning variable capacitor, however, the accuracy in manufacture thereof or applications to a VHF tuner or auto-search or auto-presetting pose a problem.

SUMMARY OF THE INVENTION

The object of the present invention is to provide a novel channel number indication system, which in order to obviate the above-mentioned shortcomings of the prior art systems, a receiving channel number is indicated directly on the basis of the output signal of the local oscillator of the tuner.

First, explanation will be made of the relation between a receiving frequency of a television receiver and a channel number or a local oscillation frequency of the tuner of the television receiver.

In U.S. television broadcasting, each channel occupies a bandwidth of 6 MHz, and the channels are arranged at intervals of 6 MHz except for intervals between channels 4 and 5, between channels 6 and 7, and between channels 13 and 14. The channels up to 13 belong to VHF band, and the channels 14 and above belong to UHF band. In this specification, therefore, channels 2 to 4 will be called VHF Low 1, channels 5 and 6 VHF Low 2, channels 7 to 13 VHF High, and channels 14 to 83 UHF for convenience's sake. VHF Low 1 and VHF Low 2 may be collectively called VHF Low.

The table below shows the relation between the receiving frequency (carrier frequency of a video signal) for each channel and a channel number and a local oscillation frequency for the most common intermediate frequency of 45.75 MHz for a television receiver.

| Band | Channel No. | $f_S + f_{IF} = f_{LO} = m \cdot n + c$ |
|---|---|---|
| VHF | 2 | $55.25 + 45.75 = 101 = 6 \times 2 + 89$ |
| Low 1 | 3 | $61.25 + 45.75 = 107 = 6 \times 3 + 89$ |
|  | 4 | $67.25 + 45.75 = 113 = 6 \times 4 + 89$ |
| VHF | 5 | $77.25 + 45.75 = 123 = 6 \times 5 + 93$ |
| Low 2 | 6 | $83.25 + 45.75 = 129 = 6 \times 6 + 93$ |
| VHF | 7 | $175.25 + 45.75 = 221 = 6 \times 7 + 179$ |
| High | 8 | $181.25 + 45.75 = 227 = 6 \times 8 + 179$ |
|  | : | : |
|  | 13 | $211.25 + 45.75 = 257 = 6 \times 13 + 179$ |
| UHF | 14 | $471.25 + 45.75 = 517 = 6 \times 14 + 433$ |
|  | 15 | $477.25 + 45.75 = 523 = 6 \times 15 + 433$ |
|  | : | : |
|  | 83 | $885.25 + 45.75 = 931 = 6 \times 83 + 433$ |

Let the receiving frequency be $f_S$, the local oscillation frequency of the tuner be $f_{LO}$, and the intermediate frequency of the receiver be $f_{IF}$. Then, the relation between the respective frequencies shown below is obtained.

$$f_{LO} = f_S + f_{IF} = m \cdot n + c$$

where m and n are integers and c a constant. If a fixed value is selected for m as a separation value depending on each band, the value n corresponding to each channel number is obtained from the equation above.

In the channel number indication system according to the present invention, an output signal of the local oscillator and a signal showing a receiving band in which the local oscillator is operating are conducted from the television receiver. The fixed value c depending on each receiving band is generated from a signal representing each receiving band, and this value c is used for correcting the count of the output signal of the local oscillator. The corrected count is divided by the separation value between the channels and thus a signal associated with the channel number received by the television receiver is generated, which signal is displayed on the indication system.

BRIEF DESCRIPTION OF THE DRAWINGS

FIG. 3 is a block diagram showing another embodiment of the present invention.

DESCRIPTION OF THE PREFERRED EMBODIMENTS

Figure 1:
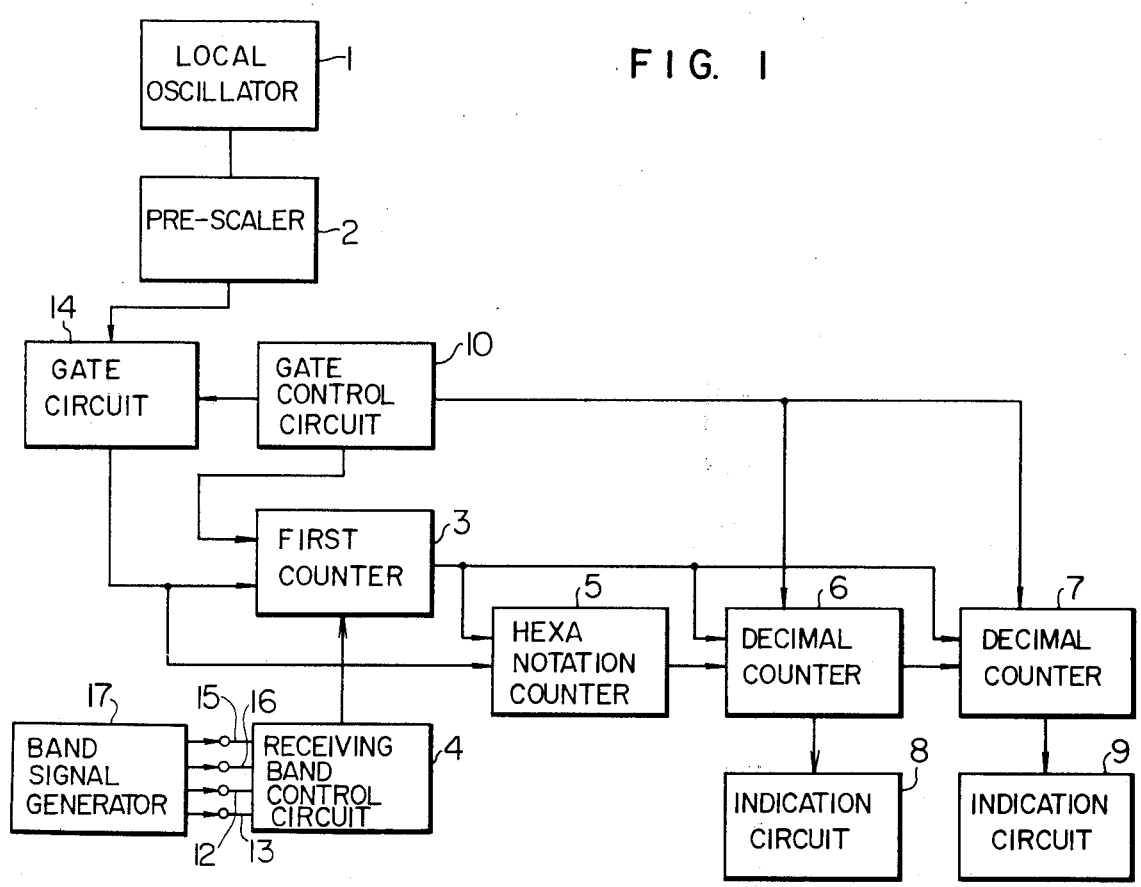
FIG. 1 is a block diagram showing an embodiment of the present invention.

An embodiment of the present invention is shown in FIG. 1. In this drawing, reference numeral 1 designates a local oscillator of a tuner of a television receiver. Numeral 2 designates a pre-scaler for frequency-dividing the output signal of the local oscillator to 1/a. It is possible to render the value a as 1, which means that the pre-scaler is omitted. Numeral 3 designates a first counter which counts the output signal of the pre-scaler 2 up to a value coincident with the initial value signal conducted from a receiving band control circuit 4 explained below, and after counting the value coincident with the initial value signal, stops counting and produces an output signal, the same process of operation being repeated after being reset. This first counter is a kind of programmable counter. The receiving band control circuit 4 is such that in response to a signal conducted to the input terminals 12, 13, 15 and 16 and representing the receiving band in which the tuner including the local oscillator 1 is operating, an initial value signal for each receiving band (a signal corresponding to c explained above) is generated. Numeral 5 designates hexa notation counter. Numerals 6 and 7 designate decimal counters, and numerals 8 and 9 indication circuits. The parts 6 to 9 make up an indication system for indicating a 2-digit numerical character. Numeral 10 designates a gate control circuit. Numerals 12, 13, 15 and 16 designate input terminals of the receiving band control circuit 4. Numeral 17 designates a band signal generator for producing a band signal representing a receiving band associated with the operation of the local oscillator. When the tuner of the television receiver is operating at VHF Low 1, the input terminal 15 is impressed with a control signal. Also, a control signal is applied to the input terminal 16 when the tuner is operating at VHF Low 2; to the input terminal 12 when the tuner is operating at VHF High; and to the input terminal 13 when the tuner is operating at UHF. Numeral 14 designates a gate circuit.

The operation of the embodiment shown in FIG. 1 will be explained. A local oscillation signal produced from the local oscillator of the tuner is appropriately waveform-shaped and frequency-divided to 1/a by the pre-scaler 2, thus producing a pulse signal of the frequency of $1/a \cdot f_{LO} \times 10^6$ MHz at the output of the pre-scaler. The symbol $f_{LO}$ shows the local oscillation frequency as mentioned above.

This pulse signal is sampled out at the gate time $T = a \times 10^{-6}$ [sec.] at the gate circuit 14. As a result, a pulse signal including the number of pulses $a \times 10^{-6} \times (1/a) \times f_{LO} \times 10^6 (= f_{LO})$ is produced at the gate output. This signal is applied to the first counter 3.

In response to the channel changing-over operation of the tuner, the signal is applied to the terminals 12, 13, 15 and 16, respectively, so that the count of the first counter 3 is set by the control circuit 4. When the band VHF Low 1 is selected by a channel selector, for instance, the first counter 3 is set at the counts of 89; similarly when the band VHF Low 2 is selected, at the counts of 93; when the band VHF High 2 is selected, at the counts of 179; and when the UHF band is selected, at the counts of 433.

As mentioned above, channels for television broadcasting are arranged at intervals of 6 MHz. Therefore, the number of pulses $f_{LO}$ equal to the local oscillation frequency $f_{LO}$ (MHz) picked up from the pre-scaler 2 at the gate time $T (= a \times 10^{-6}$ sec.) by the gate circuit 14 is $(89 + 6n)$ (n = 2, 3 or 4) for channels 2 to 4 of VHF low band, $(93 + 6n)$ (n = 5 or 6) for channels 5 and 6 of VHF low band, $(179 + 6n)$ (n = 7, 8, ... or 13) for channels 7 to 13 of VHF high band, and $(433 + 6n)$ (n = 14, 15, ..., or 83) for channels 14 to 83 of UHF band.

Thus, pulses in the number of 6n (n: channel number) remains after the first counter 3 counts the pulses picked up at the gate time of $a \times 10^{-6}$ sec, in the number of 89 for channels 2 to 4, 93 for channels 5 and 6, 179 for channels 7 to 13, and 433 for channels 14 to 83.

The output signal produced from the first counter 3 when stopping counting is used to start the hexa notation counter 5, which is caused to count the remainder of the pulses picked up from the pre-scaler 2 at the gate circuit 14, so that pulses in the number of n are produced at the output of the hexa notation counter 5. These pulses are applied sequentially to the decimal counters 6 and 7. In this way, the value n is capable of being counted up to the second order. Further, the gate control circuit 10 is held for a predetermined length of time after completion of the gate period, so that each digit of n is displayed on the indication circuits 8 and 9, thus indicating the number n, that is, the channel number.

The operations of setting the gate time, hold and indication time by the gate control circuit 10 are similar to those of an ordinary frequency counter and therefore will not be described in detail.

Figure 2:
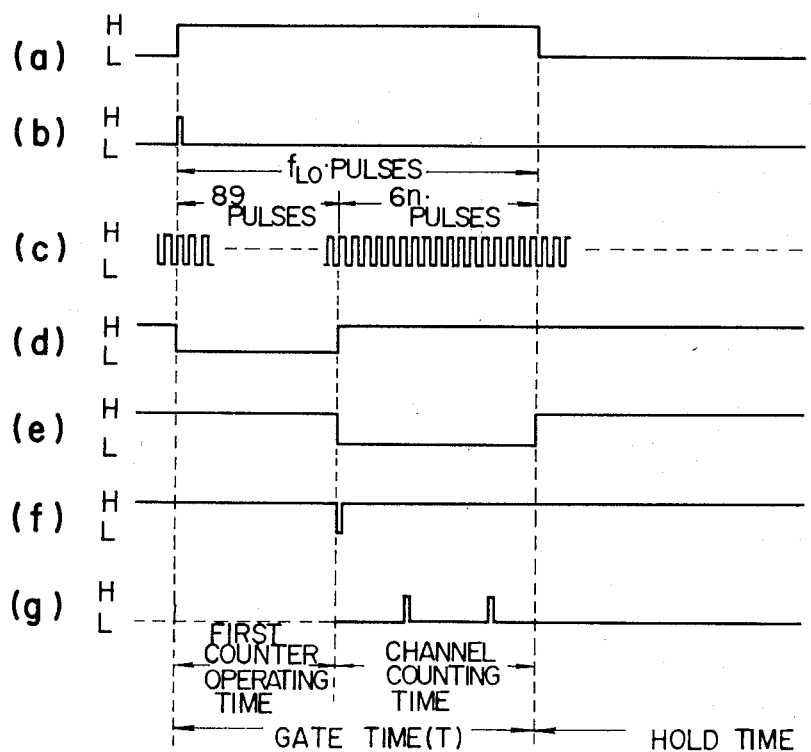
FIG. 2 is a diagram showing signal waveforms for explaining the operation of the embodiment of FIG. 1.

Signal waveforms produced at various parts in an example of operation of the channel indication system for channel 2 in FIG. 1 are shown in FIG. 2. In this drawing, (a) is a gate signal applied from the gate control circuit 10 to the gate circuit 14, (b) a start signal applied from the gate control circuit 10 to the first counter 3, (c) a pulse signal produced at the output of the pre-scaler 2, (d) an output signal of the first counter 3, and (e) the operating conditions of the counters 5 to 7, the operation being represented by level L. (f) shows a start signal applied from the first counter 3 to the counters 5 to 7, and (g) an output of the hexa notation counter 5 in the form of two pulses since n = 2 in view of the operation corresponding to channel 2. The number of pulses introduced by the hexa notation counter 5 is simply counted and indicated by a well-known method, with the result that the receiving channel number 2 is indicated. For those channels whose number n has two digits, an output is also produced from the counter 7 and a signal is also applied to the indication circuit 9, thus indicating a 2-digit number. As a matter of fact, the gate control circuit 10 controls both the counters 5 to 7 and the indication circuits 8 and 9, and after completion of counting, a latch signal holds the output of the counters 6 and 7, so that immediately after resetting of the previous indication, a new indication appears. Thus, the indication continues through the hold time and gate time, thus substantially eliminating the case of indication flicker.

In this embodiment, the frequency is divided into the four bands of VHF Low 1, VHF Low 2, VHF high and UHF. Another embodiment in which the three bands of VHF Low, VHF High and UHF are involved will be explained below.

In the case where the above-mentioned bands VHF Low 1 and VHF Low 2 are combined into VHF Low, the channels 4 and 5 have an interval of 10 MHz, which is different from the other intervals and is required to be corrected. The embodiment shown in FIG. 3 includes means for this correction. In the embodiment of FIG. 3, the component elements similar to those in FIG. 1 are denoted by the same reference numerals as in FIG. 1. Explanation will be made below only of the parts different from those in the embodiment of FIG. 1. The parts not explained below are already explained with reference to the embodiment of FIG. 1.

The signal representing the receiving band associated with the operation of the tuner is applied to the input terminal 11 when the tuner is operating at VHF Low; to the input terminal 12 when the tuner is operating at VHF High; and to the input terminal 13 when the tuner is operating at UHF. In the case where a control signal is applied to the input terminal 12 or 13 of the receiving band control circuit 4', i.e., in the case where the tuner is operating at VHF High or UHF band, the receiving channel number is indicated in exactly the same way as in the embodiment of FIG. 1.

When a control signal is applied to the input terminal 11, namely, when one of the receiving channels 2 to 6 is involved, an initial value signal representing the initial value 89 is produced from the receiving band control circuit 4'. In the case where a control signal is applied to the input terminal 11 showing the receiving channels 2 to 4, therefore, the operation is the same as that in the embodiment of FIG. 1.

In the case where a control signal is applied to the input terminal 11 and the receiving channel 5 or 6 is involved, however, the operation of the embodiment under consideration is somewhat different from that of the embodiment of FIG. 1.

In this case, the output signal of 5 counts or more produced from the counter 6 is detected, and this detection signal is applied to the receiving band control circuit 4', and thus the subsequent initial values are changed to 93. In the case where the output signal of the counter 6 is reduced to 4 counts or less after the change of the initial value to 93, on the contrary, the detection signal for 4 counts or less is applied similarly to the receiving band control circuit 4', so that the subsequent initial values are changed to 89. By doing so, in spite of the fact that an erroneous indication is made at the first count, a right indication is effected at the second and subsequent counts. Further, the time lag between the first count and the second count is reduced to the order of microseconds to milliseconds, and therefore is not substantially noted visually. The time lag depends on the indication hold time selected. The time required for counting, that is, the gate time is of the order of microseconds and therefore does not substantially pose any problem. The gate time obtained by frequency division to ½ by the pre-scaler 2 is 2 microseconds.

The present invention is not limited to the above-mentioned embodiment. Instead, the gate time and the number of digits of the counter may be increased so that only the highest two digits may be indicated, or the setting of the first counter may be displaced for an improved accuracy. Further, in consideration of the variable range of the local oscillation frequency for each channel, the initial values 89, 93, 179 and 433 in the above-mentioned embodiments may take other values. Furthermore, by selecting the setting of the first counter appropriately, the invention may be applied not only to the U.S. television broadcasting but also to other broadcasting systems having channel of different frequencies.

In addition, the tuning device is not limited to manual one but may take the form of a tuner of auto-preset type with equal effect, thus making it possible to produce a low-cost tuner having the tuning functions equal to or superior to the tuner of PLL synthesizer type.

It will be understood from the foregoing description that according to the present invention a channel number can be indicated directly by the local oscillation frequency of the tuner in a simple configuration, so that whether or not the preset condition is correct is always clear, thus making possible a correct channel indication as in the case of a high-cost memory or PLL synthesizer.

I claim:

1. A receiving channel number indication system for a television receiver, comprising (a) a local oscillator having an output terminal for producing a local oscillation signal, (b) band signal generator means having an output terminal for producing a band signal representing a receiving band associated with the operation of said local oscillator, (c) a receiving band control circuit having an input terminal connected to the output terminal of said band signal generator circuit and an output terminal for producing an initial value signal set for each receiving band, (d) a gate circuit having an input terminal connected to the output terminal of said local oscillator and an output terminal for producing an output signal obtained by controlling the passage of said local oscillation signal, (e) a first counter having an input terminal connected to the output terminal of said gate circuit, an input terminal connected to the output terminal of said receiving band control circuit, and an output terminal for producing a control signal when the count of the output signal of said gate circuit exceeds the value of said initial value signal, (f) m base notation counter (m: channel separation number) having an input terminal connected to the output terminal of said gate circuit, an input terminal connected to the output terminal of said first counter, and an output terminal for producing the result of counting the output of said gate circuit in response to the control signal produced from said first counter, (g) an indicator having an input terminal connected to the output terminal of said m base notation counter, said indicator indicating the number of pulses applied thereto, and (h) control means for supplying driving pulses to said gate circuit, said first counter and said indicator.

2. A receiving channel number indication system for a television receiver according to claim 1, wherein said m base notation counter is a hexa notation counter.

3. A receiving channel number indication system for a television receiver according to claim 2, wherein said receiving band control circuit includes means for producing a first detection signal in the case where said initial value signal takes a first value and the value of the output signal of said hexa notation counter is not less than 5 counts, and producing a second detection signal in the case where said initial value signal takes a second value and the output signal of said hexa notation counter is not more than 4 counts, and means for changing the value of said initial value signal from said first value to said second value in response to said first detection signal and changing the value of said initial value signal from said second value to said first value in response to said second detection signal.

* * * * *